United States Patent [19]
Pascucci

[11] Patent Number: 5,461,713
[45] Date of Patent: * Oct. 24, 1995

[54] CURRENT OFFSET SENSE AMPLIFIER OF A MODULATED CURRENT OR CURRENT UNBALANCE TYPE FOR PROGRAMMABLE MEMORIES

[75] Inventor: Luigi Pascucci, Sesto S. Giovanni, Italy

[73] Assignee: SGS-Thomson Microelectronics S.r.l., Milan, Italy

[*] Notice: The portion of the term of this patent subsequent to Jul. 5, 2011 has been disclaimed.

[21] Appl. No.: 270,498

[22] Filed: Jul. 5, 1994

Related U.S. Application Data

[63] Continuation-in-part of Ser. No. 878,823, May 4, 1992, Pat. No. 5,327,379.

[30] Foreign Application Priority Data

May 10, 1991 [IT] Italy ............................ VA/91/A/0012

[51] Int. Cl.[6] ..................................................... G11C 7/00
[52] U.S. Cl. ........................... 365/190; 365/210; 365/203; 365/207; 327/56
[58] Field of Search ................................... 365/190, 203, 365/205, 210, 207, 208; 327/51, 56

[56] References Cited

U.S. PATENT DOCUMENTS

| 4,694,427 | 9/1987 | Miyamoto et al. ................. | 365/205 |
| 5,138,579 | 8/1992 | Tatsumi et al. .................... | 365/210 X |
| 5,327,379 | 7/1994 | Pascucci ............................. | 365/190 |

FOREIGN PATENT DOCUMENTS 0301588  2/1989  European Pat. Off. ......... G11C 17/00

OTHER PUBLICATIONS

Gastaldi et al., "A 1-Mbit CMOS EPROM With Enhanced Verification," *IEEE J. of Solid–State Circuits* 23(5):1150–1156, 1988.

Kobayashi et al., "A High–Speed Parallel Sensing Architecture for Multi–Megabit Flash E² PROM's," *IEEE J. of Solid–State Circuits* 25(1):79–83, 1990.

*Primary Examiner*—David C. Nelms
*Assistant Examiner*—Tan Nguyen
*Attorney, Agent, or Firm*—David V. Carlson; Bryan A. Santarelli; Seed and Berry

[57] ABSTRACT

A circuit employing a modulated-current offset-type or current-unbalance, offset-type sense amplifier for reading programmable memory cells employs loads identical to each other and a differential input pair of transistors of the differential amplifier are "cross-coupled" with said identical loads to realize a latch structure for storing an extracted data. The circuit also employs a pair of pass transistors, and a pair of precharge transistors. The pass transistors connect the differential input transistors to a memory matrix and the precharge transistors charge lines of the memory matrix. By properly sizing and fabricating these transistors, the pass transistors connect the differential input transistors with the memory matrix while the currents provided from the precharge transistors are either nulled or minimized. The circuit utilizes three timing signals for sequentially modifying the configuration of the circuit and defining the following phases: start of a new reading cycle, pre-charging of capacitances associated with bit lines, and equalization of output nodes and line potentials, discrimination phase, reading and storing of the extracted data.

20 Claims, 9 Drawing Sheets

CURRENT OFFSET SENSE AMPLIFIER OF A MODULATED CURRENT OR CURRENT UNBALANCE TYPE FOR PROGRAMMABLE MEMORIES

The present application is a continuation-in-part application of a patent application entitled "CURRENT OFFSET SENSE AMPLIFIER OF A MODULATED CURRENT OR CURRENT UNBALANCE TYPE FOR PROGRAMMABLE MEMORIES" invented by Luigi Pascucci, U.S. Ser. No. 07/878,823, filed May 4, 1992 and to be issued as U.S. Pat. No. 5,327,379 on Jul. 5, 1994. This patent application is incorporated herein by reference.

TECHNICAL FIELD

The present invention relates to a circuit for reading the information stored in a cell of a programmable static memory, e.g., a ROM or EPROM type memory, according to a differential sensing system employing a sense amplifier and an output latch circuit for storing an extracted (read) data.

BACKGROUND OF THE INVENTION

Along with a constantly increasing packing density of integrated semiconductor devices, the reduction of the size of the single cells of static memory arrays, the attendant decrease of the operating current levels and the consequent magnified influence of parasitic electric factors of the integrated structures impose the use of a reading circuitry having an enhanced precision and reliability while ensuring a high speed.

The use of differential sense amplifiers attempts to treat the effects due to "process spread", temperature and supply voltage variations as common mode contributions. Moreover modulated-current offset type as well as current unbalance type sense amplifier attempts to free the sensing behavior from the maximum value that the supply voltage may reach, besides simplifying the dimensioning of transistors which form the sense amplifier in respect to the alternative load unbalance system.

Usually the required control of the output common mode of the high gain differential sense amplifier is conveniently implemented by using an output latch wherein the extracted (read) data may be stored. A sense amplifier with these characteristics is relatively complex and remains sensitive to noise.

SUMMARY OF THE INVENTION

A main objective of the present invention is to provide an improved sense amplifier of the so-called modulated-current offset type or of the current offset type, having a simplified circuit layout and employing a reduced number of components while having an enhanced immunity to noise, a high speed and a high reliability.

It is a further objective of the invention to provide a sense amplifier for a programmable memory having cross-coupled loads which also constitute a latch circuit for storing the extracted data, thus performing both amplification and output data storage functions. Basically, in the sense amplifier's circuit of this invention, the same identical load elements of the two branches or lines of the input network of the differential sense amplifier also constitute the loads of a differential input transistor pair of the amplifier and are cross-coupled whereby they form together with the same differential input transistor pair a latch circuit for storing the output data.

The different features and advantages of the circuit object of the present invention will become clear from the following description of several preferred embodiments and reference to the attached drawings.

DETAILED DESCRIPTION OF THE INVENTION

Figure 1A:
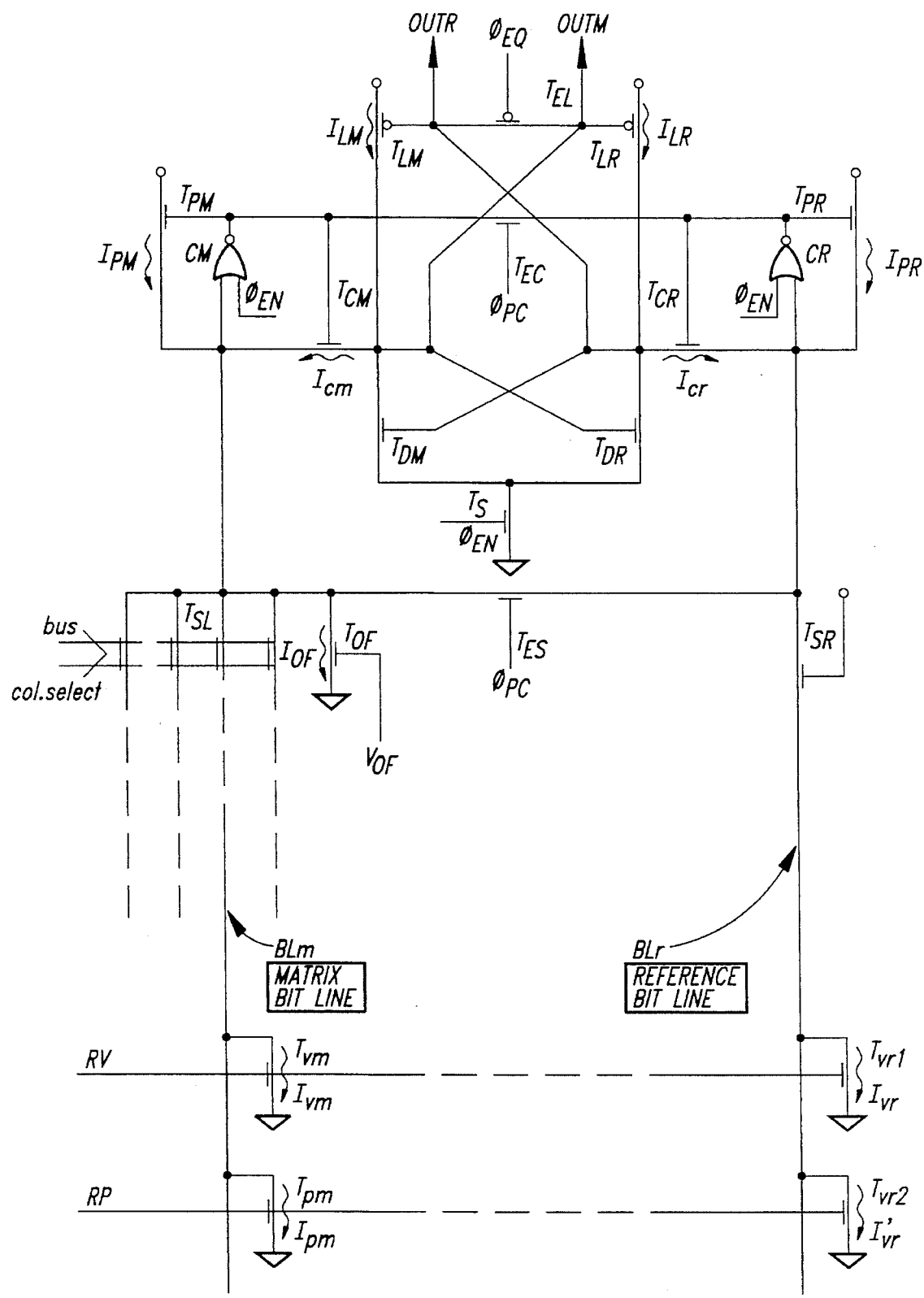
FIG. 1A is a circuit diagram of a sense amplifier of the modulated-current offset type, according to a first embodiment of the invention.

A first embodiment of the circuit of the invention, of a modulated-current offset type, is shown in FIG. 1. In the bottom half of the circuit diagram is shown in a schematic manner the organization of a memory matrix, organized in rows (word lines) and columns (bit lines) of cells. From the "matrix side", the different columns (MATRIX BIT LINE) may be individually selected through a multiplexer driven by the bus COL.SELECT. A reference bit line, BLr (REFERENCE BIT LINE), contains virgin memory cells which act as reference elements for determining the state of the programmable cells of the bit lines of the memory matrix.

The top portion of the diagram shows a reading circuit made in accordance with the invention, which employs a single stage differential amplifier formed by a pair of input transistors $T_{DM}$ and $T_{DR}$ and by a current generator $T_S$, which may be enabled or disabled. The respective load elements, which in the example shown are two p-channel transistors, $T_{LM}$ and $T_{LR}$, are cross-coupled in order to form, together with the same input transistors of the differential amplifier: $T_{DM}$ and $T_{DR}$, also a latch circuit for storing the output data which is represented by the signal present on the output nodes OUTM and OUTR of the reading circuit.

Significantly, the same loads $T_{LM}$ and $T_{LR}$ of the output latch also constitute the loads of the reference branch and of the branch containing the selected matrix cell to be read, of an input network of the differential sense amplifier, respectively. In the example shown, these branches are represented by the reference line BLr and by the selected matrix side bit line BLm. The two lines of the input network of the differential sense amplifier are precharged, in preparation of an actual reading step, through the switches $T_{PM}$ and $T_{PR}$, respectively, which momentarily connect the respective line to the supply for a preestablished time interval in order to charge the capacitances associated with the two input lines of the differential sense amplifier.

Two NOR gates, CM and CR, respectively, which may be formed by a cascode circuit, may be utilized for setting the point of operation of the sense amplifier by controlling a fast precharge of the two lines of the input network through the respective switches $T_{PM}$ and $T_{PR}$ and simultaneously the capacitive decoupling of the input lines from the output nodes of the sense amplifier: OUTM and OUTR, by means of the pass transistors $T_{CM}$ and $T_{CR}$. To an input node of each of said NOR gates, a first timing signal $\Phi_{EN}$ is applied, which is also applied to a control terminal of the current generator TS which enables the sense amplifier. When $\Phi_{EN}$ is at a high logic (1), it interrupts the path toward the bit lines (BLm and BLr) and leaves the circuit in a storing configuration. When $\Phi_{EN}$ is at a low logic (0), the output nodes of the two NOR gates (CM and CR) assume analog levels suitable to correctly bias the bit lines. A first switch $T_{EC}$ permits to equalize the output node of the two cascode circuits CM and CR during the precharge step of the input lines and a second switch $T_{ES}$ permits to equalize the input lines during the precharge step. A second timing signal $\Phi_{PC}$ is applied to the control terminals of both equalization switches $T_{EC}$ and $T_{ES}$. Eventually this second timing signal $\Phi_{PC}$ determines the start of a reading phase at the end of the precharging phase of the lines, by interrupting the respective equalization paths, that is by opening the switches $T_{EC}$ and $T_{ES}$. The switch $T_{EL}$, connected between the two output nodes of the reading circuit, maintains in a state of substantial equalization the load elements $T_{LM}$ and $T_{LR}$ of the reading circuit until the conclusive valuation phase of a reading cycle is reached, that is when the switch $T_{EL}$ is opened by the respective timing signal $\Phi_{EQ}$, in order to permit a full evolution of a difference of potential between the output nodes OUTM and OUTR.

The operation of the circuit of FIG. 1 is as follows.

Figure 2:
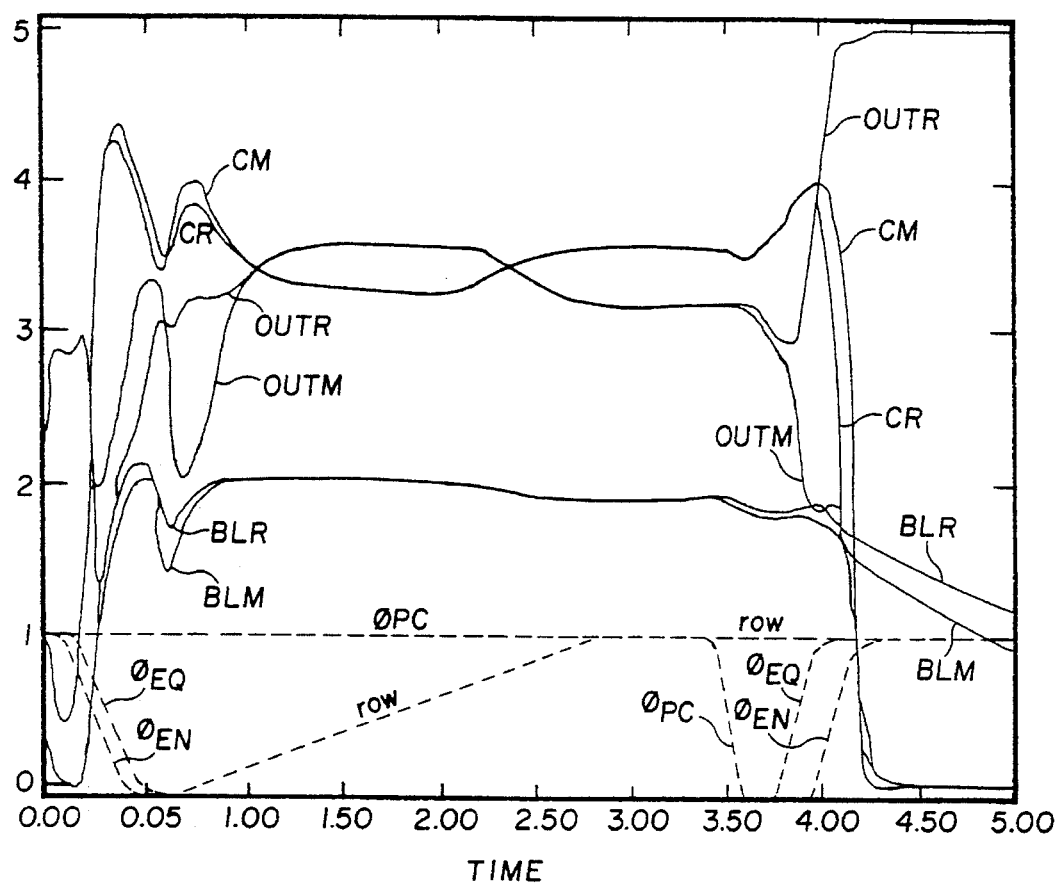
FIG. 2 is a timing diagram of the circuit of FIG. 1 during a reading cycle.

The form of the various signals of the circuit during a complete reading cycle, as described above, is shown in the diagram of FIG. 2.

The rest condition of the reading circuit, which is characterized by nil power consumption, is determined by the three timing signals: $\Phi_{EN}$, $\Phi_{PC}$ and $\Phi_{EQ}$, all at a high logic level ("1") and represents the natural condition from which any new reading cycle begins and to which the system returns after having extracted the data. In this rest condition, the output nodes of the two NOR gates, CM and CR, are forced to ground potential by $\Phi_{EN}$ being high. The output nodes OUTM and OUTR are at logically opposed levels: "1" and "0" or vice-versa, in conformity with the last extracted data stored by the circuit. No power consumption is possible because of the action of $\Phi_{EN}$, on the cascodes CM and CR and moreover the other timing signal $\Phi_{EQ}$, maintained at a logic high level, interrupts any possible path between the supply node and ground (VCC-GND).

A new reading cycle begins with the switching from "1" to "0" of the control signals $\Phi_{EN}$ and $\Phi_{EQ}$, which free the cascodes CM and CR, thus permitting them to drive a fast pre-charge of the capacitances of the reference line BLr and of the selected matrix's bit line BLm until the design working point of the sense amplifier is attained. At the same time, various nodes in the system equalize at various levels: for example at the level shown in FIG. 2 for OUTM and OUTR nodes; at the level shown for the output nodes of the two cascodes circuits, CM and CR; and at the level shown for the bit lines BLr and BLm. The circuit elements are sized and designed such that at the end of the fast pre-charge period, the pre-charge elements (e.g., $T_{PM}$ and $T_{PR}$) turn-off. Two specific examples of such sizing and designing will be explained in detail below with reference to FIGS. 1B and 1C. Once the precharge transistors turn-off, the OUTM and OUTR nodes, duly equalized, take a potential which is apt to provide, through the loads $T_{LM}$ and $T_{LR}$, the sum of the currents drawn by the selected cells of the matrix line and of the reference line.

As soon as propagation of any control signal within the circuit may be assumed as completed, this first step of the reading cycle is terminated by the switching from "1" to "0" of the control signal $\Phi_{PC}$ so as to initiate a preevaluation or discrimination phase of the state of the selected cells which will produce only relatively small potential variations at the OUTM and OUTR nodes and at the output nodes of the NOR gates (cascodes) CM and CR, but in an extremely small period of time, by virtue of the design freedom offered by the circuit of the invention to size the components of the input network so as to effectively minimize any undue shift of potential of the bit lines BLm and BLr during this critical discrimination phase.

The evaluation step is completed by the switching from "0" to "1" of the control signal $\Phi_{EQ}$ which occurs soon after said switching of the control signal $\Phi_{PC}$. When this event takes place, the small difference of potential present at the OUTM and OUTR nodes rapidly evolves firstly toward the asymptotes VCC-(VBL-VBR) and subsequently toward the asymptotes VCC-GND upon the switching back from "0" to "1" of the control signal $\Phi_{EN}$, which takes place immediately after the switching of the control signal $\Phi_{EQ}$. This sequence of events, beside digitalizing and storing the extracted data, resets automatically the system to the rest condition characterized by a nil power consumption.

Of course, the events described above take place in a short period of time, the entire cycle occurring in less than a second, thus achieving an extremely short reading time.

The current drawn by the system, after the precharge phase is terminated, is totally provided through the loads $T_{LM}$ and $T_{LR}$ in order to concentrate through the load elements the entire current signal of the system. The peculiar cross-coupled connection of the loads $T_{LM}$ and $T_{LR}$ confers to the sense amplifier a positive feedback which enhances the amplifying capacities without the need of further amplifying stages.

The load elements $T_{LM}$ and $T_{LR}$ and the differential input transistor pair: $T_{DM}$ and $T_{DR}$, in the last phase of the reading cycle are so configured as to form a latch circuit, capable of storing the extracted data beside effectively suppressing any common mode disturbance, thus making the sense amplifier exceptionally immune to noise and to other possible causes of instability.

The reference system of the sense amplifier of FIG. 1 for discriminating the state of a selected matrix's cell (virgin or programmed) utilizes a MOS transistor $T_{OF}$, which is functionally associated to the selected matrix's line. The transistor $T_{OF}$ is a current modulating transistor functionally connected to the bit line to be read. The transistor $T_{OF}$ is sized and designed to be capable of generating under any condition of supply voltage a current equal to half the current drawn by a virgin cell, and can be designed in accordance with an offsetting technique commonly referred to as "modulated-current" offsetting, which is well known to a skilled technician.

Within the circuit:

Ivm is the current drawn by a matrix's virgin cell;

Ivr is the current drawn by a reference virgin cell;

Ipm is the current drawn by a matrix's programmed cell;

Iv is the current drawn by a generic virgin cell; and

Iof is the offset current; and the circuits are designed such that:

Ivm=Ivr=Iv

Iof=Iv/2 (offset current)

Ipm=0

The following system of current inequalities affords discrimination:

Ivm+Iof>Ivr for a selected virgin cell;

Ipm+Iof<Ivr for a selected programmed cell;

Iv+Iv/2>Iv for a selected virgin cell; and

0+Iv/2<Iv for a selected programmed cell.

Figure 3A:
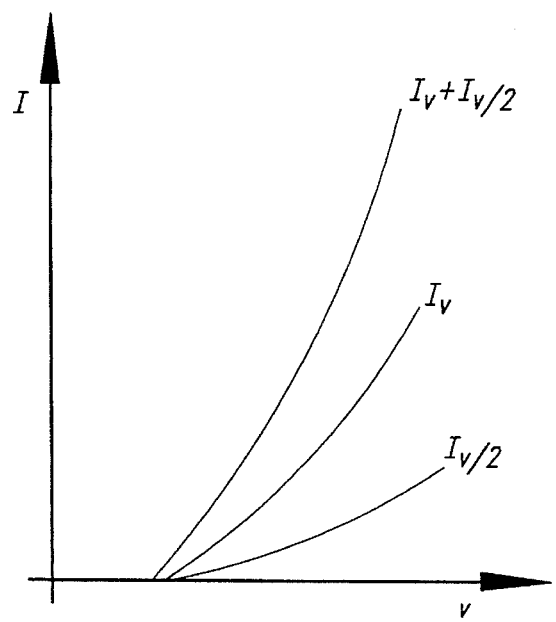
FIG. 3A is a first diagram of the operation characteristics of the sense amplifier of FIG. 1.

The curves which characterize the above inequalities are shown in the diagram of FIG. 3A.

Figure 3B:
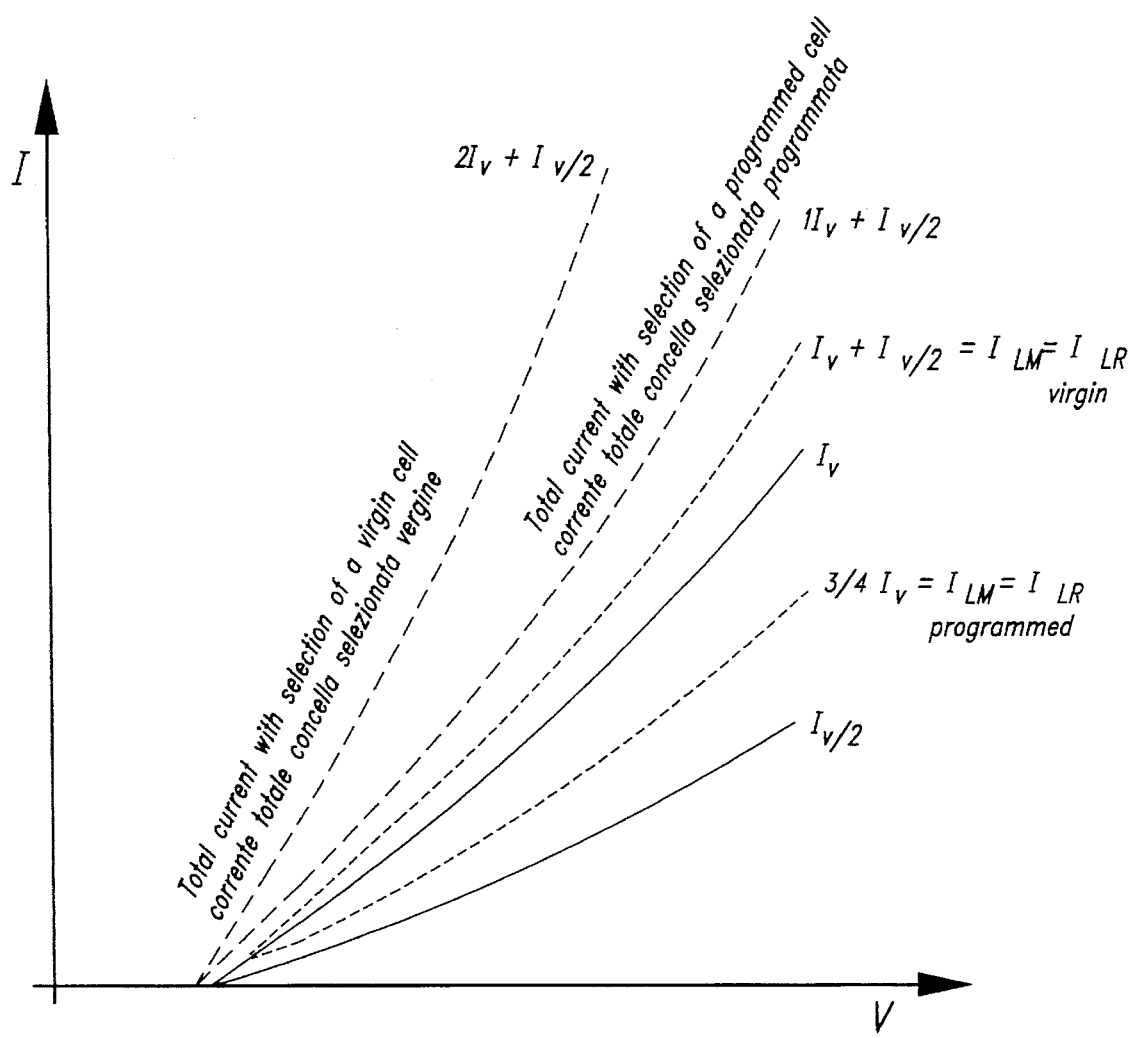
FIG. 3B is a second diagram of the operational characteristics of the sense amplifier of FIG. 1.

FIG. 3B illustrates currents that flow in the bit lines BLm and BLr at different operating voltages. In this figure, the total currents for a virgin cell and for a programmed cell are represented by dashed lines. Additionally, the respective halves of the total currents, for the two cases considered, have been drawn using dotted lines. These dotted curves represent the currents in the loads $T_{LM}$ and $T_{LR}$ for different supply voltages during the equalization phase (e.g., while $\Phi_{EQ}=0$). As discussed above transistor $T_{EL}$ ensures that these currents are substantially equal during this phase. The Currents in the loads $T_{LM}$ and $T_{LR}$ maintain themselves in a middle position in respect to the curves representing the possible currents in the bit lines. The relationships illustrated in FIG. 3B are summarized below in Table 1.

TABLE 1

|  | Total Current | Current in Loads $T_{LM}$ and $T_{LR}$ During Equilization Phase ($\Phi_{EQ} = 0$) |
| --- | --- | --- |
| Selection of a matrix virgin cell | ($2I_V + I_V/2$) | ($I_V + I_V/4$) |
| Selection of a programmed matrix cell | ($I_V + I_V/2$) | ($3/4I_V$) |

In particular, in the case where a virgin cell is selected from the matrix, the following relationships, apply:

$(I_v + I_{v/2})$ > $(I_v + I_{v/4})$ > $I_v$
current in BLm    current through the    current in
                  loads ($I_{LM}$ and $I_{LR}$)    BLr Similarly, if a programmed cell is selected from the matrix, the following relationships, apply:

$(I_{v/2})$ < $(3/4I_v)$ < $(I_v)$
current in BLm    current through the    current in
                  loads ($I_{LM}$ and $I_{LR}$)    BLr In other words, the above inequalities indicate that, for any supply voltage, the current through the loads is always greater than the current flowing in the least conductive bit line and at the same time it is always smaller than the current flowing in the most conductive bit line.

The characteristic ensures that when equalization is interrupted, the initial value of the current through the loads is "too high" or the least conductive bit line and "too low" for the most conductive bit line. Thus, when equalization is interrupted (i.e., when $\Phi_{EQ}$ is placed in a high logic state), the two nodes OUTR and OUTM immediately "diverge" from each other. The nodes diverge because the excessively high current flowing through the load that is coupled to the least conductive bit line causes a sharp rise in the current in the least conductive bit line. Simultaneously, the excessively low value of the current flowing through the load that is coupled to the most conductive bit line causes a sharp drop of the current in the most conductive bit line. The dynamic behavior of the output nodes OUTM and OUTR is divergent ab initio and is further enhanced by the positive feedback mechanism of the circuit. Subsequently, the latching phase ($\Phi_{EN}=1$), by providing for a decoupling interval of the loads from the respective bit lines (highly capacitive and commonly sluggish), automatically digitalizes the output nodes OUTR and OUTM to the levels VDD and GND, respectively, without requiring any level setting device.

Among the main advantages of the sense amplifier of the invention the following may be cited:

i) use of a reduced number of components and of amplifying stages by performing also the function of storing the extracted data within the structure of the differential sense amplifier;

ii) the only power dissipating structures are the cascode circuits which form the two NOR gates which are disabled during the evaluation step;

iii) the load elements are an integral part both of the sense amplifier as well as of the output latch associated therewith; this enhances immunity to noise during and after a reading cycle;

iv) an immediate decoupling of the large capacitances of bit lines and of the multiplexer (i.e., the structure which performs the selection of the path to a selected matrix's cell to be read) during the critical discrimination step is ensured by the circuit, thus enhancing speed and reliability;

v) good sensitivity and speed by virtue of the cross-coupled connection of the loads;

vi) the circuit has lesser design restraints than known circuits and remains operative also in presence of large variations of current levels by preventing undesired saturation conditions;

vii) the circuit is intrinsically suitable to operate in memory devices which require rather high bias levels of the lines.

Having described the operation of the first embodiment generally, the first embodiment will now be explained with reference to preferred design options.

Figure 1B:
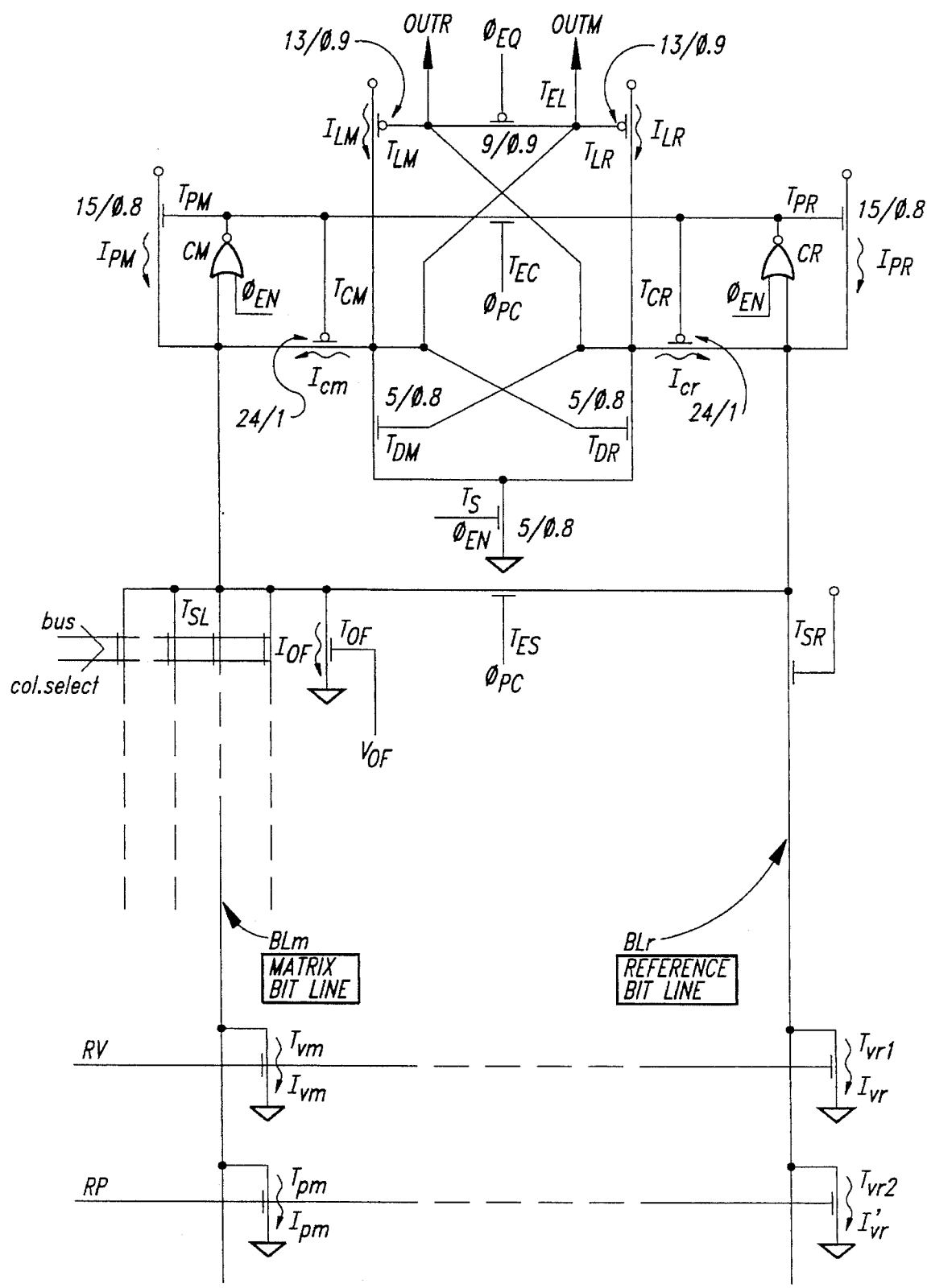
FIG. 1B is a circuit diagram illustrating an ideal design option of the first embodiment of the present invention.

FIG. 1B illustrates an ideal design option of the first embodiment. In this design option, the two pass transistors ($T_{CM}$ and $T_{CR}$) are fabricated as natural transistors. Natural transistors are shielded from any voltage threshold adjustment step. Consequently, the pass transistors ($T_{CM}$ and $T_{CR}$) retain their natural threshold voltage (e.g., a threshold voltage of approximately 0.2 volts in n-channel silicon devices). In contrast, the two precharge transistors are not shielded from the customary voltage threshold adjustment step. Consequently, the precharge transistors ($T_{PM}$ and $T_{PR}$) possess a normal threshold voltage (e.g., a threshold voltage of approximately 0.9 volts in n-channel silicon devices). By fabricating the precharge transistors ($T_{PM}$ and $T_{PR}$) to have a higher threshold than the pass transistors ($T_{CM}$ and $T_{CR}$), the precharge transistors ($T_{PM}$ and $T_{PR}$) automatically cut off after the precharge phase (e.g., the transistors cut off when $\Phi_{PC}$ drops to a low-level logic ("0"). More specifically, the analog output of the NOR gate (CM and CR) is selected so that its output will drive the pass transistors ($T_{CM}$ and $T_{CR}$), but not the precharge transistors ($T_{PM}$ and $T_{PR}$). Thus, after the precharge phase, the common current contribution provided by the precharge transistors ($T_{PM}$ and $T_{PR}$) is nulled. By nulling this common current contribution, the circuit's ability to discriminate differences between the bit lines' conductivity is enhanced. When designing the circuit using natural transistors an ideal area ratio between the pass transistors ($T_{CM}$ and $T_{CR}$) and the precharge transistors ($T_{PM}$ and $T_{PR}$) is approximately 2.0. For example, as illustrated in FIG. 1B, each pass transistor ($T_{CM}$ and $T_{CR}$) has, in micrometer units, a width/length channel ratio of (24/1), while each precharge transistor ($T_{PM}$ and $T_{PR}$) has a width/length channel ratio of (15/0.8). By sizing the transistors in this fashion, the sum of the currents drawn by the selected cells is delivered through the load transistors ($T_{LM}$ and $T_{LR}$).

Figure 1C:
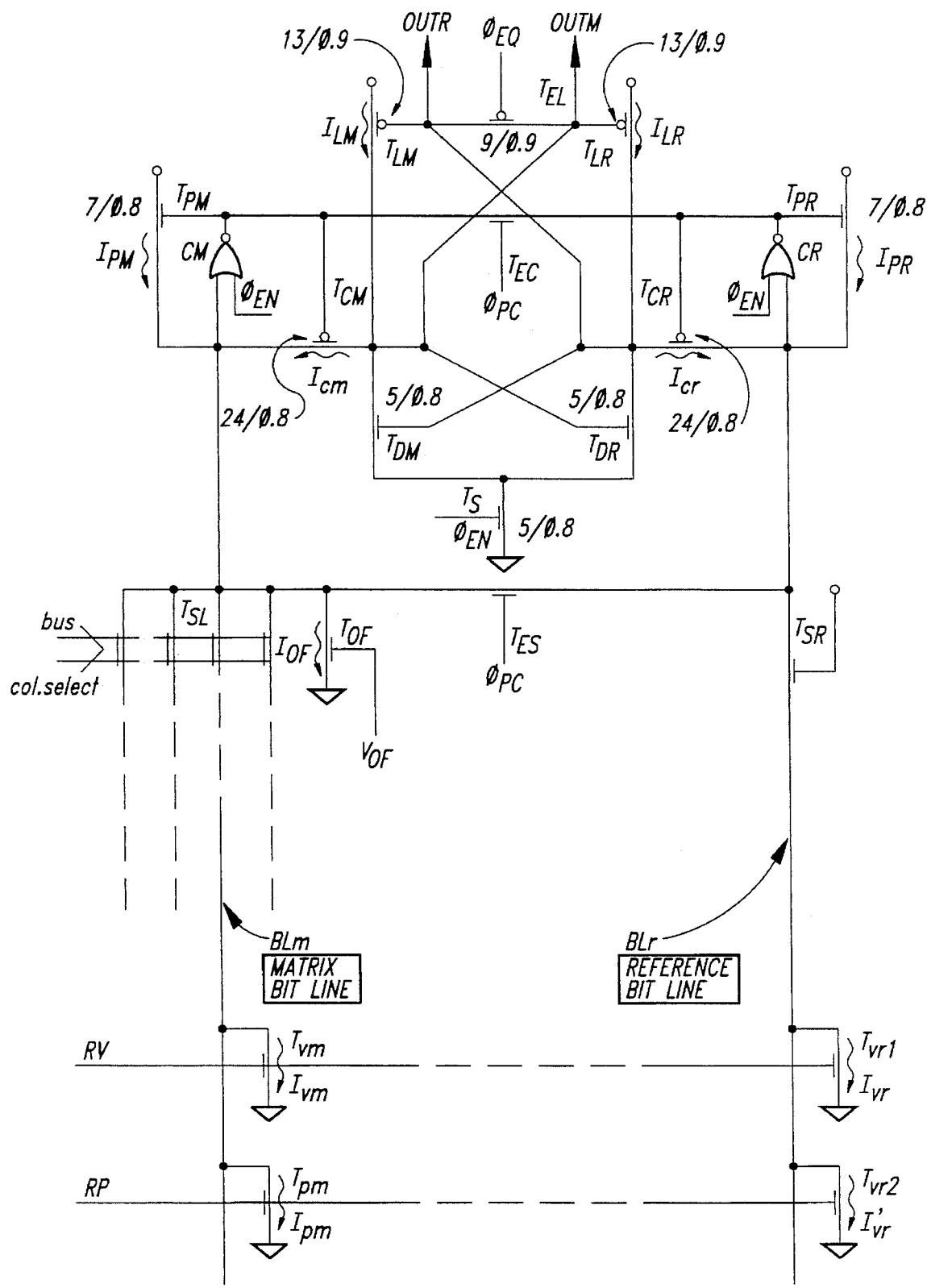
FIG. 1C is a circuit diagram illustrating an alternate design option of the first embodiment of the present invention.

FIG. 1C illustrates an alternate design option for the first embodiment of the present invention. In this design option, masking the pass transistors ($T_{CM}$ and $T_{CR}$) from the customary threshold-adjust step is assumed to be impractical. Consequently, the circuit of FIG. 1C illustrates an embodiment that utilizes "normal" transistors (e.g., transistors having a threshold of approximately 0.9 volts in n-channel silicon devices) for both the pass transistors ($T_{CM}$ and $T_{CR}$) and the precharge transistors ($T_{PM}$ and $T_{PR}$). Under these circumstances, the size of the precharge transistors ($T_{PM}$ and $T_{PR}$) is further reduced so as to minimize the currents contributed from the precharge transistors at the conclusion of the precharge phase. More specifically, an area ratio of approximately 3.4 has been found to be particularly advantageous in circuits that employ this alternate design option. For example, as illustrated in FIG. 1C, each pass transistor ($T_{CM}$ and $T_{CR}$), has in micrometer units, a width/length channel ratio of (24/0.8), while each precharge transistor ($T_{PM}$ and $T_{PR}$) has a width/length channel ratio of (7/0.8).

While the above two preferred design options represent ideal designs for the circuit of the present invention, the present invention does not have to be constructed using either of these design options. For example, even when the precharge transistors $T_{PM}$ and $T_{PR}$ and pass-transistors $T_{CM}$ and $T_{CR}$ are identically sized, the sense amplifier operates satisfactorily because the current contribution of the precharge transistors $T_{PM}$ and $T_{PR}$ does not alter the "distribution" of the current through the two loads $T_{LM}$ and $T_{LR}$. Instead, the distribution of current remains conditioned by the conductivities of the respective bit lines because the contributions of $T_{PM}$ and $T_{PR}$ are identical in the two branches.

Figure 4:
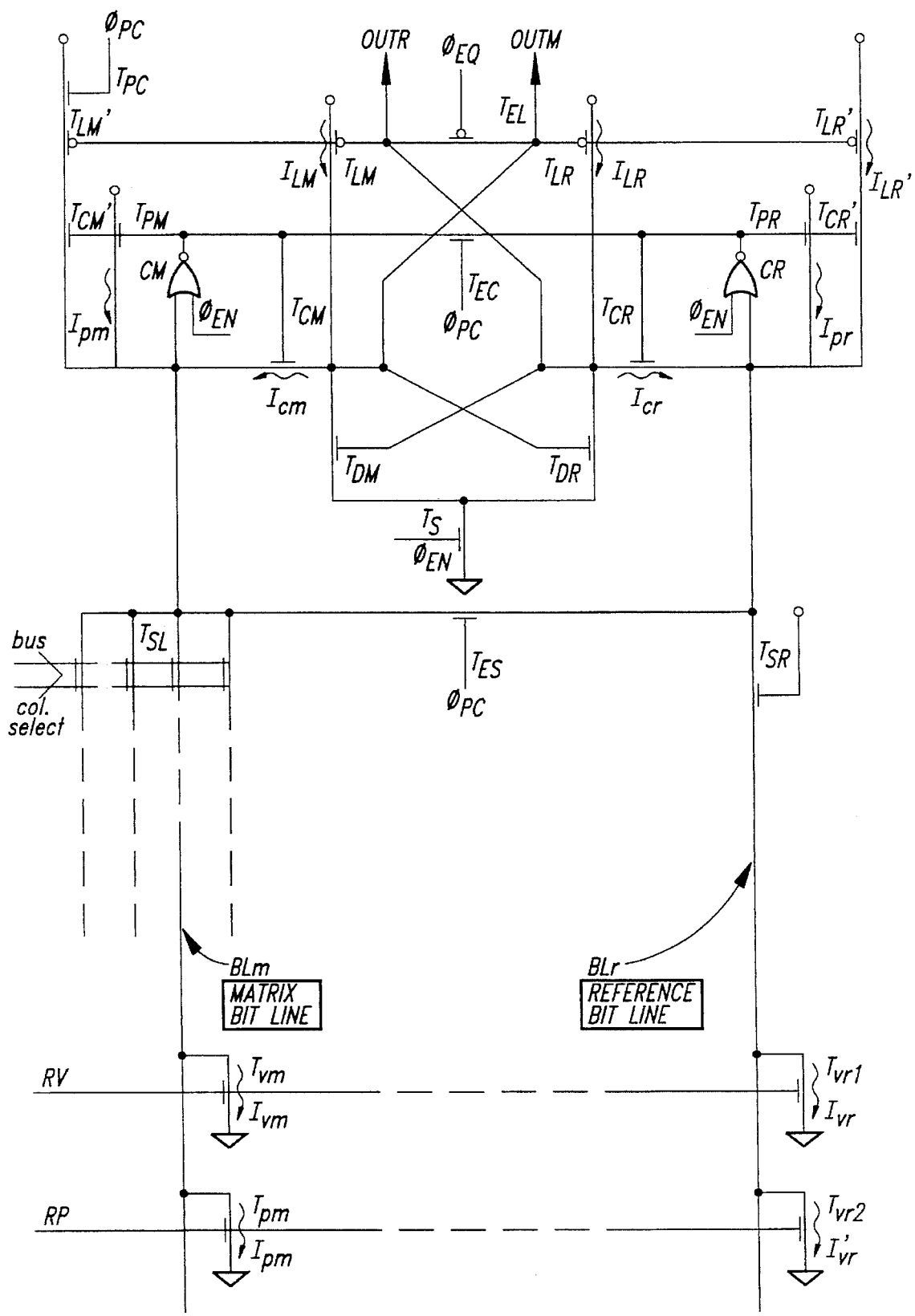
FIG. 4 is a circuit diagram of a sense amplifier the current unbalance type, according to an alternative embodiment of the present invention.

An alternative embodiment of the circuit of the invention is depicted in FIG. 4. According to this alternative embodiment there is not a current modulating transistor functionally connected to the bit line to be read as in the previously described example, by contrast the current unbalance condition is implemented in a different manner as will be described later.

Structurally the reading circuit is substantially similar to the circuit shown in FIG. 1, as confirmed by utilizing the same symbols for identifying the various functionally similar components of the two circuits.

Differently from the circuit of FIG. 1, a second connection path to the supply rail is arranged both for the reference bit line BLr and the selected matrix's bit line BLm during the fast precharging step of a reading cycle. This additional path is controlled by the switch $T_{CR}'$ in the case of the reference bit line BLr and by the switch $T_{CR}'$ and by a second switch $T_{PC}$ functionally in series with the switch $T_{cm}'$ and driven by the timing signal $\Phi_{PC}$, for the case of the selected matrix's bit line BLm. Moreover a p-channel transistor, $T_{LM}'$ and $T_{LR}'$ respectively, is connected as a load element in each of said two additional connection paths to the supply rail of the reference line and of the selected line, respectively.

Differently from known current offset circuits which normally utilize a load transistor ($T_{CR}$) of double the size of the other (dual) load transistor ($T_{LM}$) and which therefore exclude symmetry of the two branches of the input network of the sense amplifier, the addition of these two additional connection paths to the supply permits maintaining a virtually perfect symmetry of the size of transistors which makes possible the operation of the circuit also as an output latch.

Figure 5:
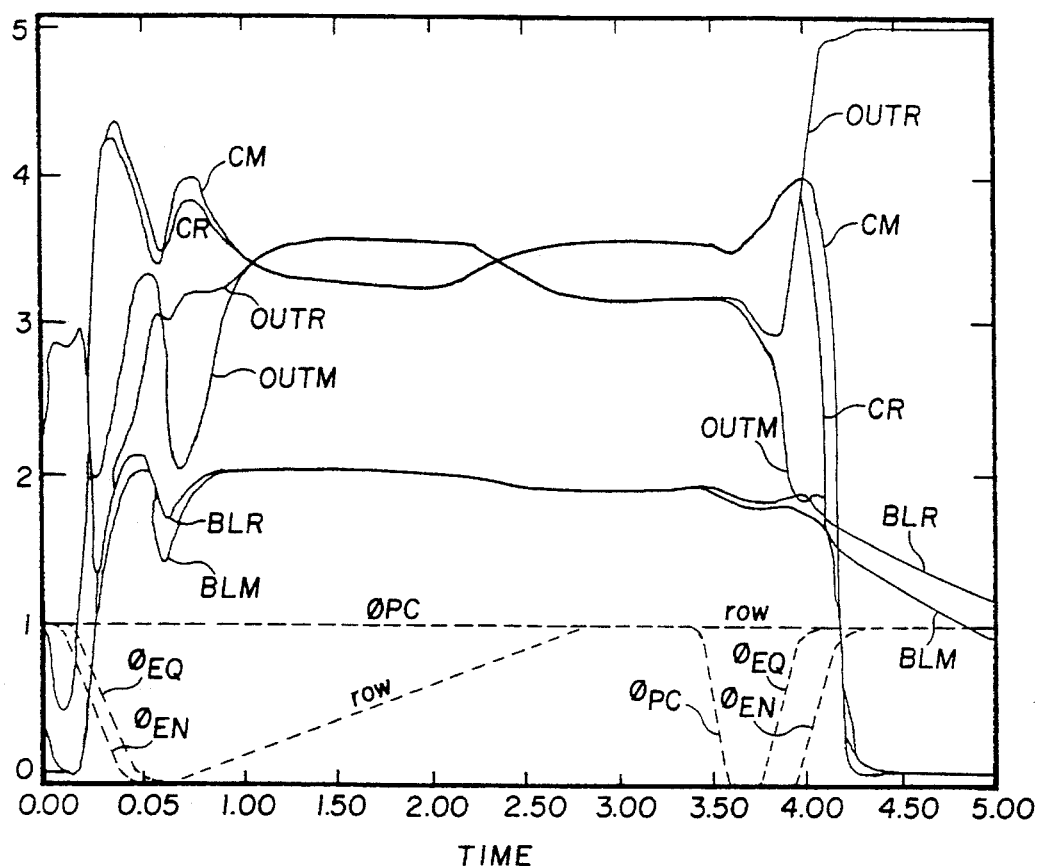
FIG. 5 is a diagram of the circuit of FIG. 4 during a reading cycle.

The operation of the reading circuit of FIG. 4 is as follows:

The form of the various signals of the circuit of FIG. 4 during a complete reading cycle, as now described, is shown in the diagram of FIG. 5.

The rest condition of the reading circuit, which is characterized by nil power consumption, is determined by the three timing signals: $\Phi_{EN}$, $\Phi_{PC}$ and $\Phi_{EQ}$, all at a high logic level ("1") and represents the natural condition from which any new reading cycle begins and to which the system returns after having extracted the data. In this rest condition, the output nodes of the two NOR gates, CM and CR, are forced to ground potential by $\Phi_{EN}$. The output nodes OUTM and OUTR are at logically opposed levels: "1" and "0" or vice-versa, in conformity with the last extracted data stored by the circuit. No power consumption is possible because of the action of $\Phi_{EN}$, on the cascodes CM and CR and moreover the other timing signal $\Phi_{EQ}$, maintained at a logic high level, interrupts any possible path between the supply node and ground (VCC-GND).

A new reading cycle begins with the switching from "1" to "0" of the control signals $\Phi_{EN}$ and $\Phi_{EQ}$ which free the cascodes CM and CR, thus permitting them to drive a fast precharge of the capacitances of the reference line BLr and of the selected matrix's bit line BLm until the design working point of the sense amplifier is attained. At the same time various nodes in the system equalize at various levels, for example at the load's level shown in FIG. 5 for OUTM and OUTR nodes; at the level shown for the output nodes of the two cascodes circuits, CM and CR; and at the level shown for the bit lines BLr and BLm. At the end of the fast pre-charge period, the OUTM and OUTR nodes, duly equalized, take a potential which is apt to provide, through the loads $T_{LM}$, $T_{LR}$ and $T_{LM}'$, $T_{LR}'$, the sum of the currents drawn by the selected cells of the matrix line and of the reference line. as soon as propagation of any control signal within the circuit may be assumed as completed, this first step of the reading cycle is terminated by the switching from "1" to "0" of the control signal $\Phi_{PC}$ which interrupts the additional connection path of the selected matrix's bit line to the supply and the equalization paths between the output nodes of the two cascodes CM and CR and the two lines BLm and BLm so as to initiate a preevaluation phase of the state of the selected cells which will produce only relatively small potential variations at the OUTM and OUTR nodes and at the output nodes of the NOR gates (cascodes) CM and CR, but in an extremely small period of time, by virtue of the design freedom offered by the circuit of the invention to size the components of the input network so as to effectively minimize any undue shift of potential of the bit lines: BLm and BLr during this discrimination phase.

The evaluation step is completed by the switching from "0" to "1" of the control signal $\Phi_{EQ}$ which occurs soon after said switching of the control signal $\Phi_{PC}$. When this event takes place, the small difference of potential present at the OUTM and OUTR nodes rapidly evolves firstly toward the asymptotes VCC-(VBL-VBR) and subsequently toward the asymptotes VCC-GND upon the switching back from "0" to "1" of the control signal $\Phi_{EN}$, which takes place immediately after the switching of the control signal $\Phi_{EQ}$. This sequence of events, besides digitalizing and storing the extracted data, resets automatically the system to the rest condition characterized by a nil power consumption.

Of course, the events described above take place in a short period of time thus achieving an extremely short reading time.

The current drawn by the system, after the initial precharge phase and the discrimination phase is terminated, is provided through the loads $T_{LM}$ and $T_{LR}$ in order to concentrate through the load elements of the sense amplifier the entire current signal of the system.

The peculiar cross-coupled connection of the loads $T_{LM}$ and $T_{LR}$ confers to the sense amplifier a positive feedback which enhances the amplifying capacities without the need of further amplifying stages.

The load elements $T_{LM}$ and $T_{LR}$ and the differential input transistor pair: $T_{DM}$ and $T_{DR}$, in the last phase of the reading cycle are so configured as to form a latch circuit, capable of storing the extracted data beside effectively suppressing any common mode disturbance, thus making the sense amplifier exceptionally immune to noise and to other possible causes of instability.

The reference system of the sense circuit of FIG. 4 is different from that of the circuit of FIG. 1. In order to permit to the sense amplifier to discriminate the state of a selected matrix's cell (virgin or programmed), a current unbalance at the loads level, which on the other hand must remain virtually identical in order to permit a correct operation of the circuit also as an output latch, is implemented by opening the switch $T_{PC}$ thus interrupting, at the end of the fast precharging phase, the additional current contribution of the secondary or additional precharge path through the matrix's bit line selected for reading, which is controlled by the switch $T_{CM}'$ and which is provided with a load $T_{LM}'$.

Within the circuit of FIG. 4:

Ivm is the current drawn by a matrix's virgin cell

Ivr is the current drawn by a reference virgin cell

Ipm is the current drawn by a programmed matrix's cell

Iv is the current drawn by a generic virgin cell

Ilm is the current drawn by the load on the matrix side $T_{LM}$

Ilr is the current drawn by the load on the reference side $T_{LR}$

Ilr' is the current drawn by the unbalancing load $T_{LR}'$ on the reference side Icm is the current through the pass-transistor $T_{CM}$ Icr is the current through the pass-transistor $T_{CR}$ Icr' is the current through the pass-transistor $T_{CR}'$ and:
   Ivm=Ivr=Iv
   Ipm=0
   Ivm=Icmv
   Ivp=Icmp
   Ivr=Icr+Icr'
   Icr=Icr'
   Icr=Ivr/2

The following system of inequalities affords discrimination:

Icmv>Icr for a selected virgin cell;

Icmp<Icr for a selected programmed cell;

Ivm>Ivr/2 for a selected virgin cell;

Ipm<Ivr/2 for a selected programmed cell;

Iv>Iv/2 for a selected virgin cell; and

0<Iv/2 for a selected programmed cell.

Figure 6:
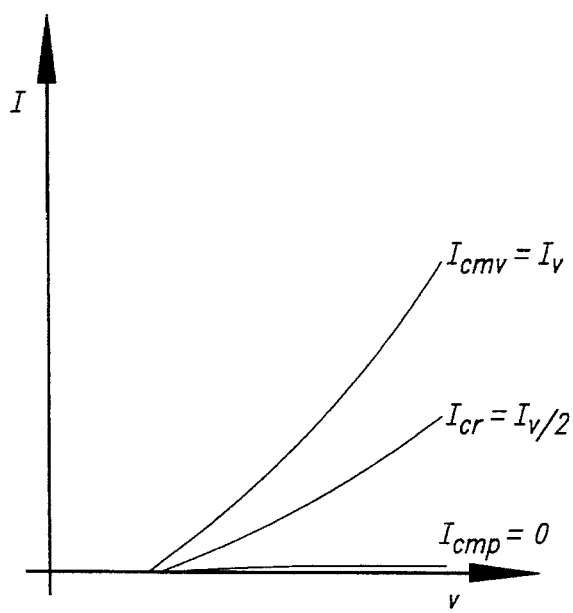
FIG. 6 is a diagram of the operation characteristics of the sense amplifier of FIG. 4.

The curves which characterize the above inequalities are shown in the diagram of FIG. 6.

Also in the case of the alternative embodiment of FIG. 4, the sense circuit of the invention offers the same advantages of the circuit of FIG. 1.

Figure 7:
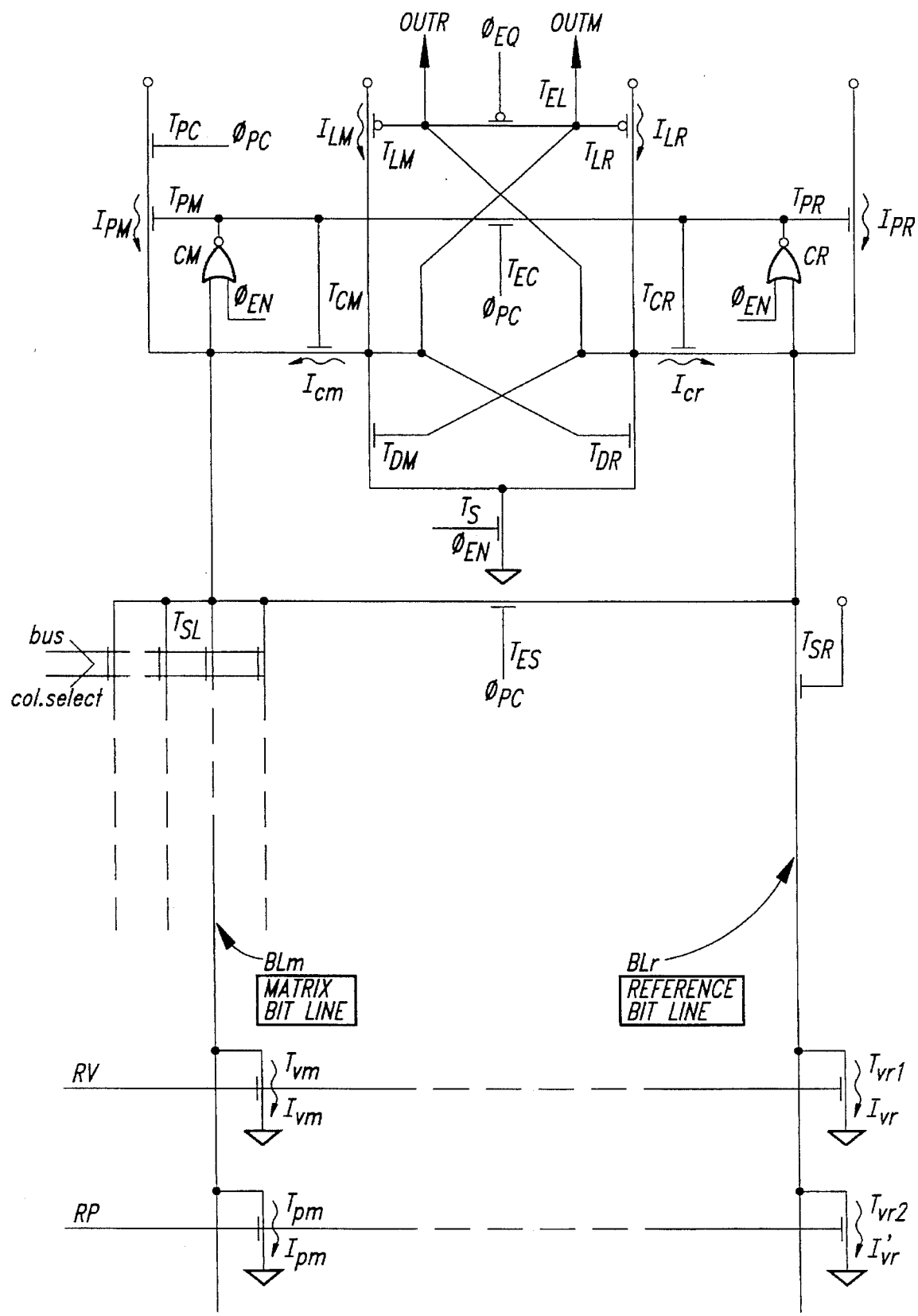
FIG. 7 is a circuit diagram of another embodiment of a current offset type sense amplifier according to the invention.

A current offset type embodiment of the sense circuit of the invention, may also be realized in a simpler form than that of FIG. 4, i.e., according to a simplified circuit diagram, as shown in FIG. 7.

In this further embodiment, the current offsetting elements in the two branches of the input network of the sense amplifier are constituted by the transistors $T_{PC}$ and $T_{PM}$ on the matrix side and by the transistor $T_{PR}$ on the reference side.

Figure 8:
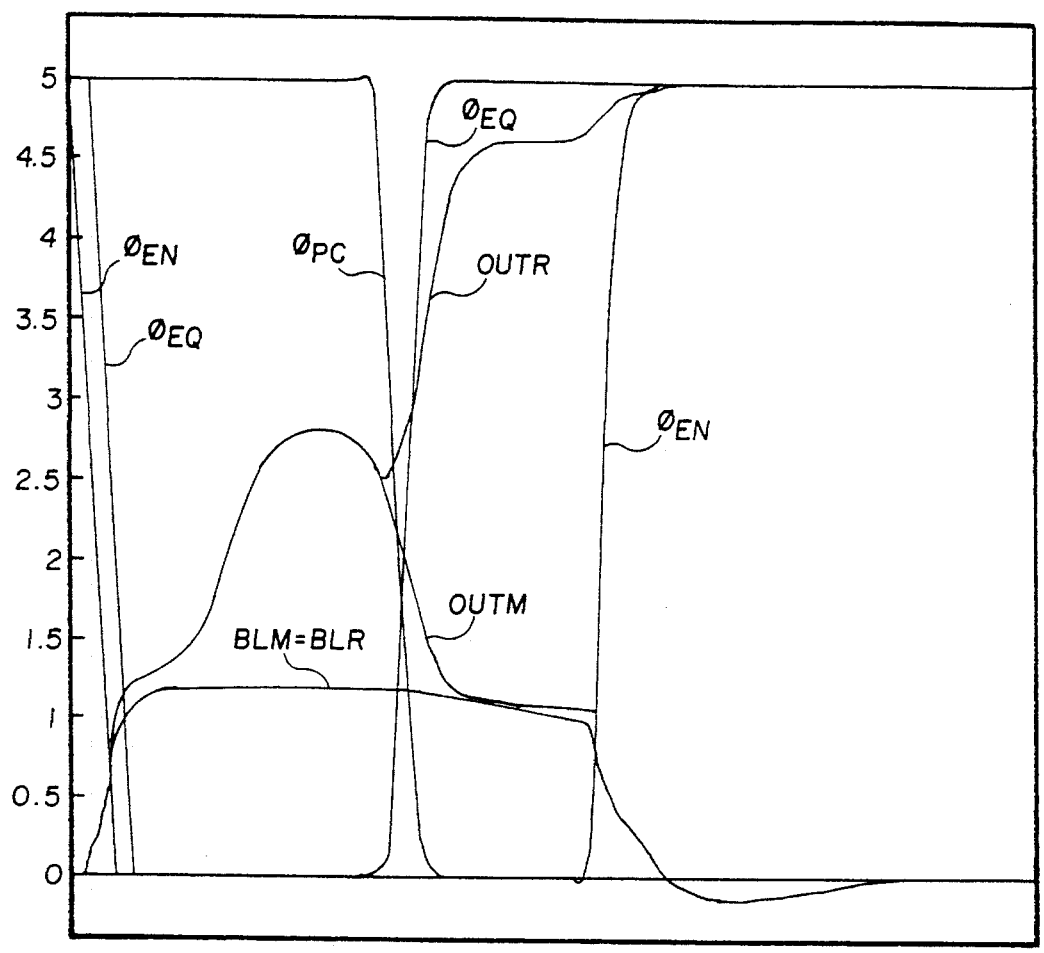
FIG. 8 is a timing diagram of the circuit of FIG. 7 during a reading cycle.
Figure 9:
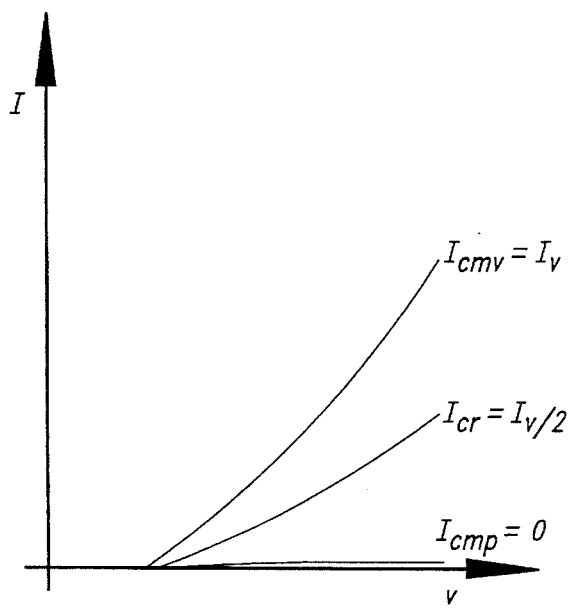
FIG. 9 is a diagram of the operation characteristics of the current offset type sense amplifier of FIG. 7.

The operation of the reading circuit of FIG. 7 is substantially similar to that of the circuit of FIG. 4, as will be evident to any skilled technician. Therefore a further reiteration of a detailed description of the operation of the circuit would be superfluous. The form of the relevant signals, during a complete reading cycle, is shown in the diagram of FIG. 8 and the characteristics of the discriminating system are shown in the diagram of FIG. 9.

Also the sense amplifier's circuit of FIG. 7 offers substantially the same advantages of the circuits of the preceding embodiments.

I claim:

1. A circuit for detecting the conductivity of cells of a memory matrix, the memory matrix having a reference cell coupled to a reference bitline and a selected cell coupled to a selected bitline, the circuit comprising:

an amplifying stage having a selected cell input node, a selected cell output node, a reference cell input node, and a reference cell output node;

a first timing signal;

a first logic gate having a first input, a second input, and an output, the first input being coupled to the selected bitline and the second input being connected to the first timing signal;

a first precharge transistor for selectively precharging the selected bitline, the first precharge transistor having a control terminal coupled to the output of the first logic gate;

a first pass transistor for selectively connecting the selected cell input node with the selected bitline, the first pass transistor having a control terminal coupled to the output of the first logic gate;

a second logic gate having a first input, a second input, and an output, the first input being coupled to the reference bitline and the second input being connected to the first timing signal;

a second precharge transistor for selectively precharging the reference bitline, the second precharge transistor having a control terminal coupled to the output of the second logic gate; and a second pass transistor for selectively connecting the reference cell input node with the reference bitline, the second pass transistor having a control terminal coupled to the output of the second logic gate.

2. The circuit of claim 1 wherein the precharge transistors have a higher threshold than the pass transistors.

3. The circuit of claim 2, wherein the pass transistors have channel areas that are approximately twice as great as channel areas of the precharge transistors.

4. The circuit of claim 3, wherein the channel areas of the pass transistors have, in micrometer units, width/length ratios of about 24/1 and wherein the channel areas of the precharge transistors have, in micrometer units, width/length ratios of about 15/0.8.

5. The circuit of claim 1, wherein the pass transistors have threshold voltages that are approximately equal to the threshold voltages of the precharge transistors.

6. The circuit of claim 5, wherein the pass transistors have channel areas that are approximately 3.4 times as great as channel areas of the precharge transistors.

7. The circuit of claim 6, wherein the channel areas of the pass transistors have, in micrometer units, width/length ratios of about 24/0.8 and wherein the channel areas of the precharge transistors have, in micrometer units, width/length ratios of about 7/0.8.

8. The circuit of claim 1, wherein the amplifying stage comprises:

a second timing signal;

a first equalization switch that selectively connects the selected cell output node with the reference cell output node, the first equalization switch being controlled by the second timing signal;

a third timing signal; and a second equalization switch that selectively connects the control terminal of the first precharge transistor with the control terminal of the second precharge transistor, the second equalization switch being controlled by the third timing signal.

9. The circuit of claim 8, wherein the pass transistors are fabricated as natural transistors and wherein the precharge transistors have threshold voltages that are greater than threshold voltages of the pass transistors.

10. The circuit of claim 9, wherein each pass transistor has a channel area that is about twice as large a channel area of each precharge transistor.

11. The circuit of claim 8, wherein the pass transistors and the precharge transistors have approximately equal threshold voltages, and wherein each pass transistor has a channel area that is approximately 3.4 times as great as a channel area of each precharge transistor.

12. A device for reading data from a memory matrix, the memory matrix providing a memory line having a selected cell and a reference line having a reference cell, the device comprising:

a differential amplifying stage having a memory input node, a reference input node, a memory output node, a reference output node, a first load element, a second load element, a first differential transistor, a second differential transistor, a latching switch, and a first equalizing switch, the memory input node being coupled to a control terminal of the first differential transistor, to the memory output node, to a first end of the first load element, and to a first non-control terminal of the second differential transistor, the reference input node being coupled to a control terminal of the second differential transistor, to the reference output node, to a first end of the second load element, and to a first non-control terminal of the first differential transistor, the first load element having a second end coupled to a supply voltage so that the first load element is positioned between the supply voltage and the memory input node, the second load element having a second end coupled to the supply voltage so that the first load element is positioned between the supply voltage and the reference input node, the first differential transistor having a second non-control terminal selectively coupled to a reference voltage via the latching switch, the second differential transistor having a second non-control terminal selectively coupled to a reference voltage via the latching switch, the latching switch selectively coupling the first and second differential transistors to the reference voltage in response to a first control signal, the first equalizing switch selectively coupling the memory output node and the reference output node in response to a second control signal;

a first precharge element that precharges the memory line by selectively coupling the memory line to the supply voltage;

a second precharge element that precharges the reference line by selectively coupling the reference line to the supply voltage;

a second equalizing switch that simultaneously enables the first precharge element and the second precharge element in response to a third control signal;

a first pass transistor that selectively couples the memory input node to the memory line; and a second pass transistor that selectively couples the reference input node to the reference line.

13. The device of claim 12 wherein the first and second precharge elements are transistors having channel regions that are smaller than channel regions of the first and second pass transistors.

14. The device of claim 13 wherein the pass transistors have a lower threshold voltage than the precharge elements.

15. The device of claim 12 wherein the first and the second precharge elements are precharge transistors having threshold voltages that are approximately equal to threshold voltages of the pass transistors.

16. The device of claim 12 wherein the pass transistors have channel regions that are greater than channel regions of the precharge transistors.

17. A method for reading information stored in a cell of a programmable memory matrix, the programmable memory matrix having a selected matrix bitline that contains a selected cell and a reference bitline that contains a reference cell, the method comprising the steps of:

using a first precharge transistor to charge the matrix bitline, the first precharge transistor selectively coupling the matrix bit line to a supply voltage;

using a second precharge transistor to charge the reference bitline, the second precharge transistor selectively coupling the reference bit line to the supply voltage;

using a pair of logic gates to drive a pair of pass transistors, the first pass transistor connecting the selected matrix bit line to a matrix bit line sense node of a differential amplifying stage, the second pass transistor connecting the reference line to a reference line sense node of the differential amplifying stage;

comparing the conductivity of the selected matrix bit line with the conductivity of the reference line by forcing a current of a predetermined level through each of the lines and through a load functionally connected to each line in order to convert a differential current signal into a voltage difference; and amplifying said voltage difference via the differential amplifying stage in order to produce a logic voltage difference between two output nodes of the differential amplifying stage.

18. The method of claim 17, wherein the precharge transistors have a higher threshold voltage than the pass transistors.

19. The method of claim 18, wherein the pass transistors have channel areas that are approximately twice the size of channel areas of the precharge transistors.

20. The method of claim 17, wherein the precharge transistors have threshold voltages that area approximately equal to the threshold voltages of the pass transistors, and wherein the precharge transistors have channel regions that are approximately 3.4 times smaller than channel regions of the pass transistors.

* * * * *